United States Patent [19]

Tubbs

[11] Patent Number: 4,700,088

[45] Date of Patent: Oct. 13, 1987

[54] DUMMY LOAD CONTROLLED MULTILEVEL LOGIC SINGLE CLOCK LOGIC CIRCUIT

[75] Inventor: Graham S. Tubbs, Tempe, Ariz.

[73] Assignee: Texas Instruments Incorporated, Dallas, Tex.

[21] Appl. No.: 921,878

[22] Filed: Oct. 20, 1986

Related U.S. Application Data

[63] Continuation of Ser. No. 520,880, Aug. 5, 1983.

[51] Int. Cl.⁴ .................... H03K 17/28; H03K 19/96
[52] U.S. Cl. .................................... 307/480; 307/443; 307/453; 307/468; 307/481; 365/233
[58] Field of Search ................ 307/443, 448, 451–453, 307/465, 468, 469, 480, 481, 449, 269; 364/716; 365/203, 233

[56] References Cited

U.S. PATENT DOCUMENTS

| | | | |
|---|---|---|---|
| 3,566,153 | 2/1971 | Spencer, Jr. .................. | 307/468 |
| 3,866,186 | 2/1975 | Suzuki ........................... | 307/452 X |
| 4,291,247 | 9/1981 | Cooper, Jr. et al. ............. | 307/481 |
| 4,501,977 | 2/1985 | Koike ............................ | 307/481 X |

FOREIGN PATENT DOCUMENTS

| 66131 | 5/1980 | Japan ................................. | 307/443 |

*Primary Examiner*—Stanley D. Miller
*Assistant Examiner*—D. R. Hudspeth
*Attorney, Agent, or Firm*—Richard K. Robinson; James T. Comfort; Melvin Sharp

[57] ABSTRACT

A multi-level logic circuit includes a first plurality of logic circuits that are connected in a cascade arrangement. A second plurality of dummy logic circuits also connected in casacade arrangement are used to generate logic pulses for evaluating the first plurality of logic circuits. A clock source provides a precharged signal to the first plurality of logic circuits and the second plurality of dummy logic circuits and an evaluation circuit is used to combine the clock signal with an output signal from the dummy logic signal to obtain an evaluation signal for evaluating the logic states of the first plurality of logic circuits.

7 Claims, 4 Drawing Figures

DUMMY LOAD CONTROLLED MULTILEVEL LOGIC SINGLE CLOCK LOGIC CIRCUIT

This application is a continuation of application Ser. No. 520,880, filed 08/05/83.

BACKGROUND OF INVENTION

This invention relates to multi-level logic circuits and in particular, those multi-logic level circuits that operate with a single clock pulse.

Dynamic multi-level logic circuits that are manufactured by the metal oxide silicon process require a multiphase clock to insure the proper implementation of the desired logic function. The implementing of a priority multilevel logic function requires the partitioning of the logic into time slots and then assigning the required number of clock phases to cover the worse case or maximum number of logic levels that are to be implemented. The phases of the clock are generated by dividing a clock signal from a basic signal source down. This results in multiple phases of clock signals, typically all phases being related to a basic source frequency that is divided down by one, two, four, etc., which means that all the phases of the clock are multiples of the basic source frequency. In this scheme, the frequency of operation is increased until one phase, which is normally only one, becomes critical. When this happens, many of the logic levels are left with redundant time available to complete the decision operation.

Although MOS circuits are considered economical to manufacture, because of the necessity of requiring separate clock phases for precharging and evaluation of the logic levels, these circuits are normally not utilized in many high speed circuits.

SUMMARY OF THE INVENTION

A multilevel logic circuit includes a first plurality of logic circuits that are connected in a cascade arrangement. A second plurality of dummy logic circuits also connected in cascade arrangement is used to generate logic pulses for evaluating the first plurality of logic circuits. A clock source provides a precharge signal to the first plurality of logic circuits and the second plurality of dummy logic circuits and an evaluation circuit is used to combine the clock signal with an output signal from the dummy logic circuits to obtain an evaluation signal for evaluating the logic states of the first plurality of logic circuits.

A multilevel logic circuit is disclosed in which the evaluation pulse is provided to correspond with the availability of data to be evaluated at each level.

The evaluation circuit is combined with a multilevel logic circuit to obtain a high speed programmable logic array.

These embodiments, as well as advantages and objects of the invention, may be ascertained from reading of the specification in combination with the figures.

DETAILED DESCRIPTION OF THE PREFERRED EMBODIMENT

Figure 1:
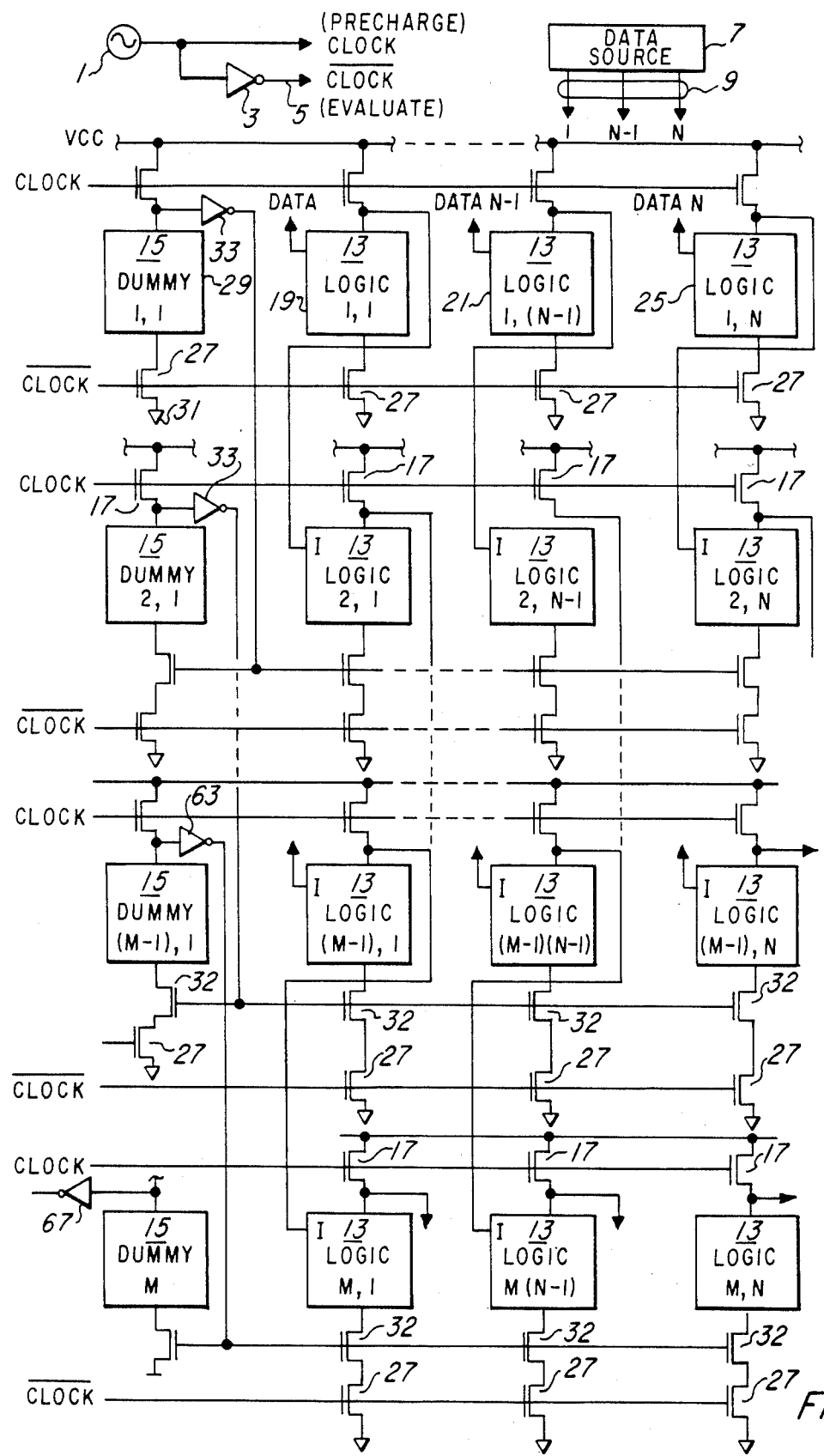
FIG. 1 is a block diagram of a multilevel logic circuit according to the invention.

In FIG. 1, to which reference shall now be made, there is shown a block diagram of a dummy load controlled multilevel logic system 10 and single clock. A clock source 1 provides a clock signal to the dummy load controlled multilevel logic system 10, as well as to an inverter 3, which produces an inverted clock signal, $\overline{CLOCK}$, that is applied to the dummy load controlled multilevel logic system 10 via conductor 5. A data source 7 such as a memory, register or other device, provides parallel data signals, DATA 1 through DATA N, via data bus 9 to the dummy load control multilevel logic system 10. The dummy load control multilevel logic system 10 includes M times N logic elements 13. The logic elements 13 are divided into words having a width of N logic elements that are connected together in cascade arrangement to form an N by M matrix, which corresponds to a multi-level logic system of M level, having a width of N bits. Additionally, there are M dummy load circuits 15 that are also connected in cascade arrangement. Each logic element 13 and each dummy element 15 is precharged by the clock signal activating the gate of transistors 17 causing VCC, provided from a source not shown, to be applied to the corresponding logic element 13 and dummy logic elements 15. The 1,1 logic element 19, 1, (N−1) logic element 21 and 1, N logic element 25, are evaluated by the CLOCK signal activating transistors 27 which connects the corresponding logic elements to reference potential at arrows 31. A 1,1 dummy element 29 is also evaluated by the clock signal and because the 1,1 dummy element 29 is connected to be representative of the worst case condition for any of the logic elements 13 that are connected in the first row an evaluation pulse is provided by an inverting amplifier 33 to the logic elements 13 that are located in the second row. The logic elements 13 in the second row are connected in cascade arrangement with the logic elements in the first row and are thus able to be evaluated as soon as an evaluation signal is provided to the gates of the transistors 32, which are connected with transistors 27 to form AND gates for ANDing the output of the inverter 33 with the clock signal that is provided from the inverter 3. It should be noted that the data from the data source 7 is connected to the corresponding input terminals of the logic elements in the first row and the outputs of the logic elements in the first row that are present on the Q terminals are connected to corresponding logic elements on the second row at the input terminals, thus, creating the cascade connection. This configuration is carried on completely through all M rows. The dummy elements 15 of each row are similarly connected in a cascade arrangement, with each representing the worst possible condition as far as propogation delays of the signal to insure that when an evaluation pulse is provided on the outputs of the inverters 33 that the corresponding logic has completed all logical operations. The evaluation of the dummy load control multi-level logic system 10 only requires (M−1) dummy logic systems; however, if the data that is provided on the outputs of the logic elements 13 are members of the M row and is to be stored in a memory location, then a store pulse may be provided on the final output inverter 33 of the M dummy logic 39.

Figure 2:
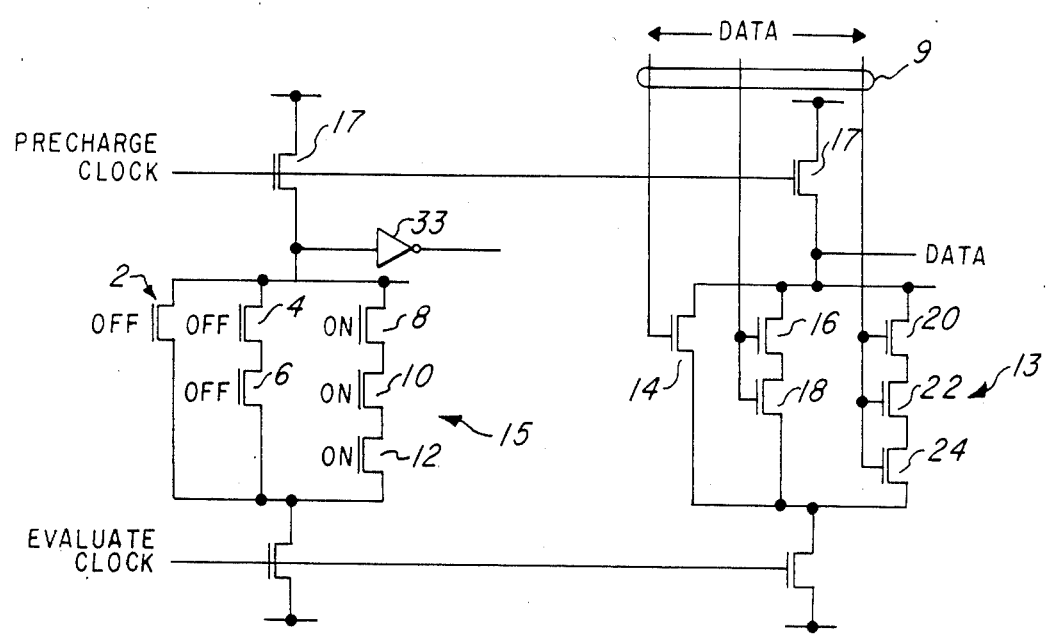
FIG. 2 is a symplified diagram of a dummy load circuit and a logic element according to the invention.

FIG. 2, to which reference should now be made, there is shown a simplified schematic diagram of a dummy load circuit 15 and a logic element 13. The dummy load 15 is connected in the worst case condition so as to insure that when an evaluation pulse is provided at the output of inverting amplifier 33 that the appropriate logic element 13 is ready for evaluation. As an example the logic element 13 includes 3 parallel rows of transistors arranged such that the first row has a single transistor 14, the second row has a series combination of transistors 16 and 18 respectively, and the third row has a series combination of three transistors 20, 22 and 24. The worst case condition for the logic element 13 based upon the data that is provided by the data bus 9 is for transistors 14, 16 and 18 to be in the off condition and transistors 20, 22 and 24 to be in the on condition. Consequently, the dummy load element 15 has a transistor 2 which is in parallel with a series combination of transistors 4 and 6 which is also in parallel arrangements with a series combination of three transistors 8, 10 and 12. The three transistors 8, 10 and 12 are on and the transistors 2, 4 and 6 are in the off state. Therefore, when the evaluation clock that is provided on the output of inverting amplifier 33 is applied to the next stage to be provided the data that is provided on the output of, the logic element 13, the data is valid data and can be utilized by the next row of logic elements.

Figure 3:
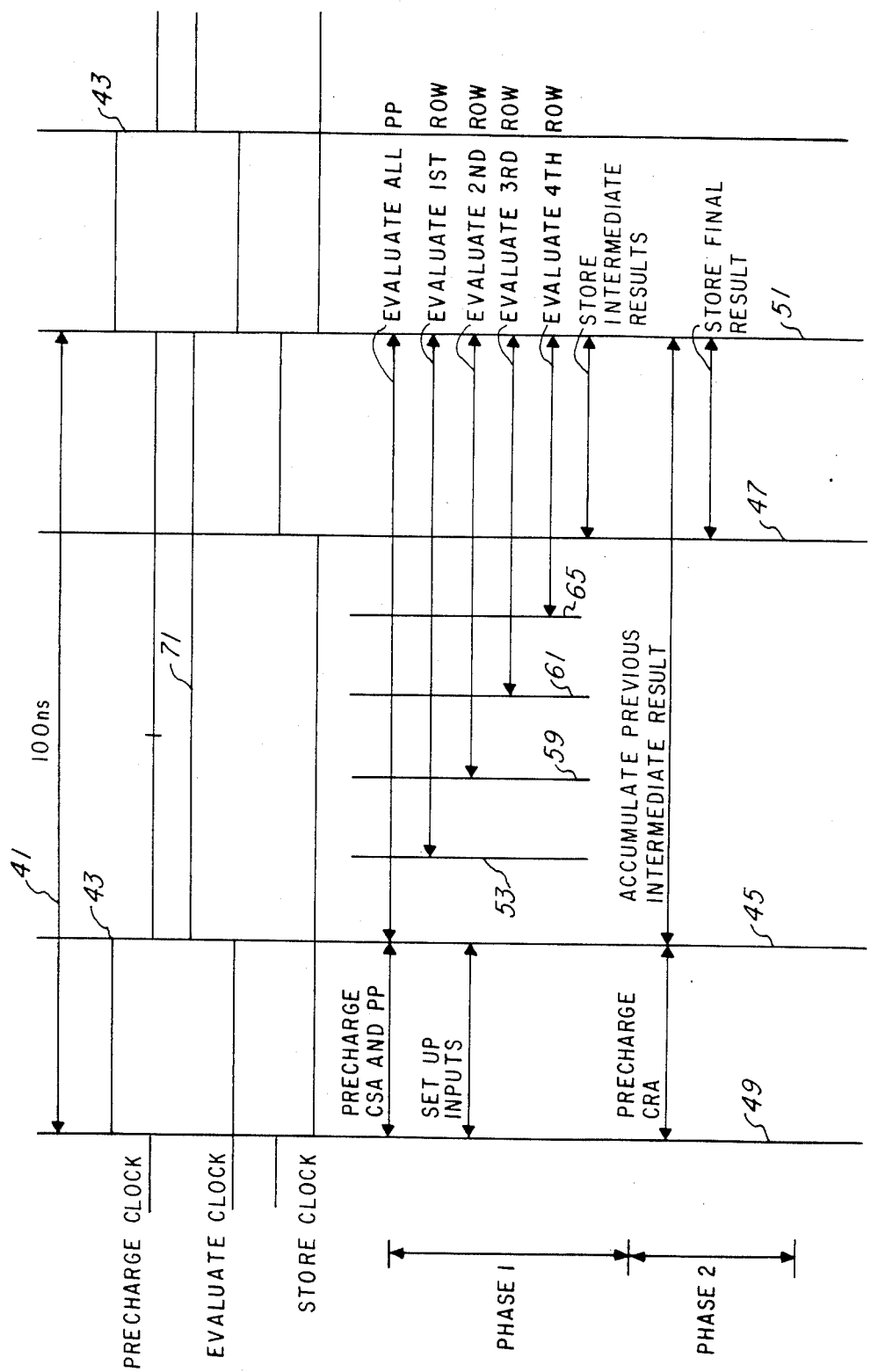
FIG. 3 is a timing diagram of the multilevel logic circuit of FIG. 1.

A timing diagram of the operation of the logic circuit of FIG. 1 is provided in FIG. 3, to which reference should now be made. The clock pulses that is provided by the clock source 1 in the preferred embodiment has a time window of 100 nanoseconds as indicated by the arrow 41 of FIG. 3. There is illustrated two precharge clock pulses 43 which of course represent the output of the clock source 1. The inverted clock is the output of the inverter 3 and is true during the period of time between vertical lines 45 and 51. There are essentially three phases to the operation of the dummy load control multilevel logic system 10 of FIG. 1. These include the precharged phase as indicated as period of time between vertical lines 49 and 45, the evaluation period of time as indicated by the period of time between vertical lines 45 and 47 and the store period of time, as indicated as a time period between the lines 47 and 51. When the precharge clock as indicated by pulse 43 is true, then the transistors 17 connect logic elements 13 and dummy elements 15 to VCC, precharging the lines thereby. At vertical line 45, the precharge clock pulse 43 is removed and the evaluate clock is provided at vertical line 45 by the output of the inverter 3 going positive. At this time, the transistors 27 connect the outputs of the logic elements 13 and dummy elements 15 that are members of the first row to the reference potential such as ground and these circuits are evaluated and the results of the evaluation are placed on the Q output terminals, each of which of course is connected to a corresponding element input terminal on the second row. The evaluation of the first row is indicated by the period of time between lines 45 and 51. Inverter 33 provides an evaluation pulse that begins at vertical line 53 and the second row of logic elements 13 as well as the dummy element 15 are evaluated during this period of time. The 2,1 dummy element 15 provides a worst case pulse on the output of inverter 57 at vertical line 59 which indicates that the next row, which in the case of FIG. 1, is Row 3, is ready for evaluation at vertical line 61. This process continues and the dummy element 15 that is a member of the Mth row, which in the case of FIGS. 1 and 3 is the 4th row, will provide an enable pulse on the output of inverter 63 at vertical line 65, indicating that the final row is ready to be evaluated. In the case of the embodiment of FIG. 1, where the results of the dummy load control multilevel logic system 10 evaluation are to be stored in a memory, a store pulse is provided by the M dummy logic 39 via an inverter 67. This indicates that at line 47, all data may be stored by a store pluse, which is a period of time that occurs between vertical lines 47 and lines 51. At line 51, the precharge pulse 43 appears and causes the evaluation clock 71 to be removed by the inverter 3 and thus all evaluation signals that occur between vertical lines 45 and 47 are removed and all circuits are precharged by the precharge pulse 43 and repeating of the process that was previously discussed and represented in FIG. 3 begins again.

Figure 4:
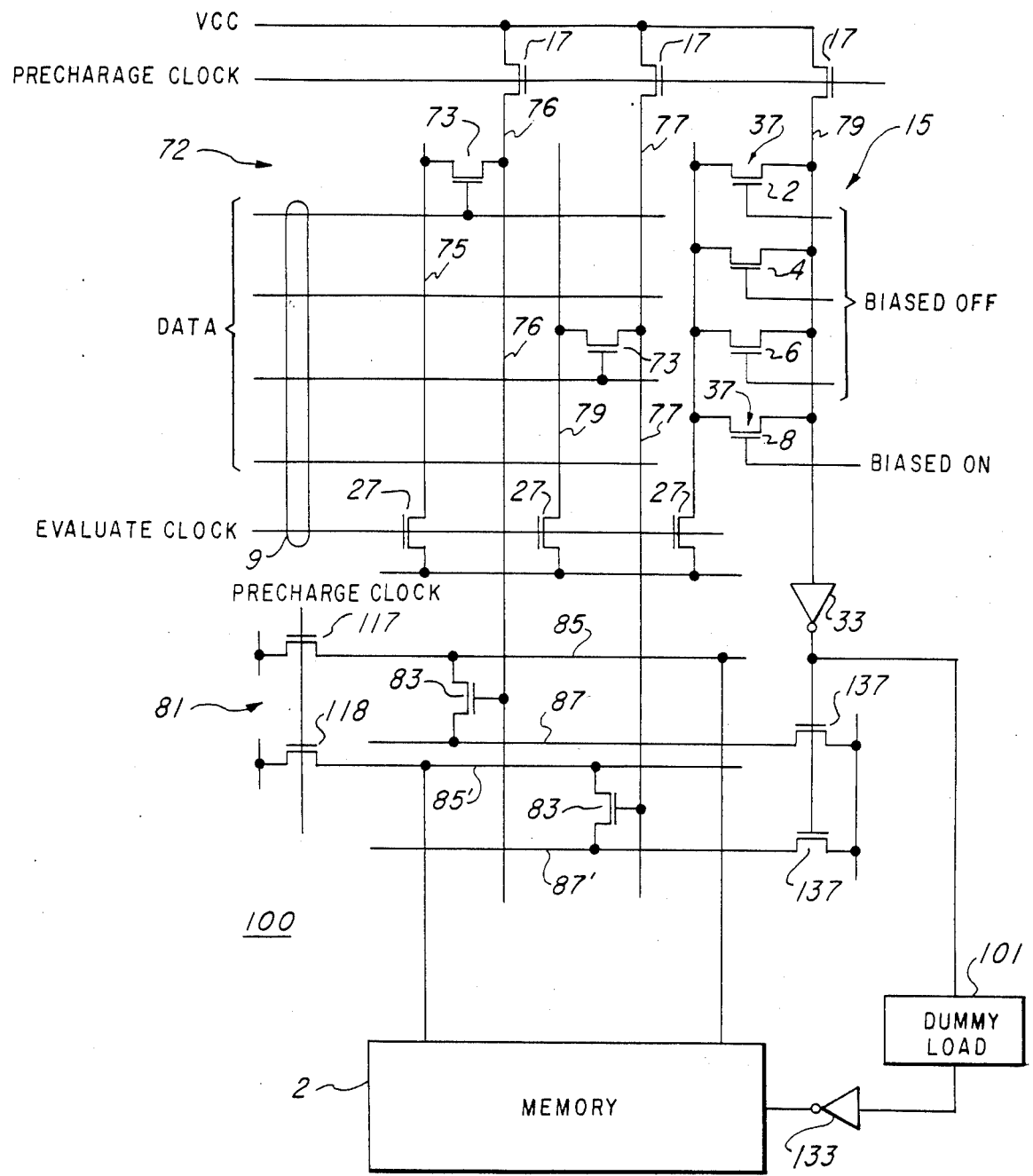
FIG. 4 is a schematic diagram of a programmable logic array according to the invention.

In FIG. 4, to which reference should now be made, there is shown a schematic diagram of a programmable logic array 100 whose outputs are connected to a memory 2. The programmable logic array 100 includes two stages. A first decode stage 72 in which the data that is present on data bus 9 decodes information according to the placement of transistors 73 between the x-coordinates that is represented by the data IN lines and the y-coordinates, represented by vertical lines, 76, 77, and 79. When the data is decoded, it is applied to a second stage 81, which is the output stage and is used to drive the load which in the case of FIG. 4, is a memory. The programming of the output stage is represented by transistors 83, which provide connections between the vertical lines 76 and 77, and the horizontal lines 85 and 87 85' and 87'. The dummy load circuit 15 is connected in the worst case condition by having a single transistor 37 connected between the x-axis and the y-axis of the programmable logic array 100. It is obvious that the greater the number of conducting transistors, the quicker the lines that are connected to the transistors 27 will be discharged. Consequently, a single on transistor, and all off transistors for all data lines except one is the worst case arrangement. Thus a transistor 8 is biased on and transistors 2, 4 and 6 are biased off in the embodiment of FIG. 4. The enable signal is ANDed with the clock signal by the configuration of the transistors 8 and 27 that is contained within the dummy logic 15. This causes a pulse to be provided on the output of the inverter 33, thus enabling the transistors 137 so that the second stage 81 of the programmable logic array may be evaluated, provided that the clock signal is removed from the transistors 17. The output is applied to the memory 2 where if the second dummy circuit 101 is evaluated, then the inverter 133, provides a store pulse to the memory 2, and the output of the programmable logic array may be stored in memory 2.

Although the present invention has been described in relation to a specific preferred environment, it will be clearly understood by those skilled in the art that other optional features may be included within the dummy load multilevel logic system 10 or subsituted for features described without departing from the scope of the invention.

What is claimed is:

1. A multilevel logic circuit comprising
a first plurality of M×N logic circuit means with each single logic circuit means having a predetermined circuit configuration, with the plurality of M×N logic circuit means being arranged into a second plurality of M rows of a third plurality of N logic circuit means with the rows ranging from a first row through an Mth row with each single logic circuit means of the third plurality of N logic circuit means of the first row being connected to a corresponding single logic circuit means of a next sequential row and similar connections being made between each single logic circuit means of each single row of logic circuit means such that a cascade connection is made between a single logic circuit means of the first row through the corresponding single logic circuit means of the Mth row and each single logic circuit means of the first plurality of M×N logic circuit means being enabled by a first pulse and where M×N, M and N are positive integers, for providing an output signal at the occurrence of an evaluation signal;

a plurality of M dummy logic circuit means with each single dummy logic circuit means having a similar circuit configuration as the predetermined circuit configuration, and connected in cascade arrangement, from a first dummy logic circuit means through an Mth dummy logic circuit means for providing, in response to each single first pulse, a plurality of M evaluation pulses as a result of the first pulse propagating through the similar circuit configuration with predetermined single dummy logic circuit means being operatively connected to predetermined single rows of logic circuit means for providing evaluation pulses thereto with predetermined members of the second plurality of M rows of logic circuit means responding to the provided evaluation pulse; and means for providing a plurality of first pulses, respectively connected to each logic circuit means and to each dummy logic circuit means of the plurality of M dummy logic circuit means.

2. The multilevel logic circuit according to claim 1 wherein each logic circuit means of the plurality of M×N logic circuit means comprises:

a circuit capable of storing predetermined data in each logic circuit means.

3. The multilevel logic circuit according to claim 2 further comprising a logic array including:

a plurality of X data input lines for inputting data to the plurality of M×N logic circuit means, a plurality of Y of decode lines for obtaining thereon the predetermined data as a decoded signal in response to inputted data on the plurality of data input lines;

an X by Y matrix of the plurality of M×N logic circuit means where Y is also a positive integer and represents the number of decode lines and X additionally represents the number of data input lines, both the data input lines and decode lines are operatively connected to the second plurality of M rows of logic circuit means; and the similar circuit configuration for each dummy logic means of the plurality of M the dummy logic means includes a single array means connected to be representative of the worst case signal propagation time delay of predetermined single row of logic circuit means to which it is connected to provide thereby the evaluation pulses to the X by Y matrix of the plurality of N logic circuit means.

4. The multilevel logic circuit according to claim 3 wherein the logic array further comprises:

an output stage means having preselected data stored therein and operatively connected to the X by Y matrix via the decode lines for providing output signals representative of the stored preselected data as decoded by the signals on the decode lines, said output stage means being connected to the Mth dummy logic circuit means and enabled by an Mth evaluation pulse provided thereby.

5. A method of implementing a multilevel logic circuit comprising: providing an output signal, at the occurrence of an evaluation signal, from a first plurality of MxN logic circuit means arranged into a second plurality of M rows of a third plurality of N logic circuit means electrically connected in rows from a first row to an Mth row and in columns for a first column to an Nth column with each single logic circuit means of the first row and column being electrically connected to corresponding single logic circuit means of the first column and a second row through the Mth row such that a cascade connection is made between a single logic circuit means of the first row through the corresponding logic circuit means of the Mth row with the logic circuit means of single columns being similarly connected for all N columns where M and N are positive integers and each single logic circuit means having a predetermined circuit configuration;

providing, in response to every occurrence of a first signal, a plurality of M evaluation pulses from a third plurality of M dummy logic circuit means, each single dummy logic circuit means having a similar circuit configuration wherein each single evaluation pulse is the result of the propagation of the first signal through the similar circuit configuration and the plurality of M dummy logic circuit means being connected in cascade arrangement from a first dummy logic circuit means through an Mth dummy logic circuit means with dummy logic circuit means being connected to a predetermined row of logic circuit means such that the first dummy logic circuit means provides an evaluation pulse of the plurality of M evaluation pulses to the first row and similarly for each single dummy logic circuit means an evaluation pulse is provided to a corresponding row of logic circuit means from the first row and dummy logic circuit means through the Mth row and dummy logic circuit means with the Mth dummy logic circuit means providing an evaluation pulse to the Mth row; and providing the first signal to each member of the third plurality of dummy logic circuit means.

6. A logic array comprising: a X by Y matrix logic means of a plurality of N logic circuit means having a predetermined circuit configuration of a second plurality of stages and where X and Y are both positive integers representing a number of data input lines and a number of decode lines respectively and each single logic circuit means of the plurality of N logic circuit means being enabled by a first signal and evaluated by an evaluation signal;

a dummy logic means that includes a single logic means of the second plurality of stages and having a similar circuit configuration as the predetermined circuit configuration and connected to be representative of the worst case first signal propagation time delay of a predetermined single stage of the X and Y matrix logic means to which it is connected and for providing an evaluation pulse to the X and Y matrix logic means in response to the first signal that propagates through the similar circuit configuration; and means for providing the first signal to the X by Y matrix logic means, to the dummy logic means and remaining circuitry.

7. The logic array according to claim 6 wherein the X by Y matrix logic means includes a means for storing predetermined data therein and means for decoding the predetermined data with signals present on the data input lines to obtained signals, representative of the decoded data, on the decode lines and the programmable logic array further comprises:

an output stage means having preselected data stored therein for providing an output signal representative of the stored preselected data when decoded by signals decode lines.

* * * * *